(12) United States Patent
Chiu

(10) Patent No.: US 12,480,973 B2
(45) Date of Patent: Nov. 25, 2025

(54) PROBE CARD DEVICE

(71) Applicant: PRINCO CORP., Hsinchu (TW)

(72) Inventor: Pei-Liang Chiu, Hsinchu (TW)

(73) Assignee: PRINCO CORP., Hsinchu (TW)

( * ) Notice: Subject to any disclaimer, the term of this patent is extended or adjusted under 35 U.S.C. 154(b) by 0 days.

(21) Appl. No.: 17/883,830

(22) Filed: Aug. 9, 2022

(65) Prior Publication Data

US 2023/0288450 A1    Sep. 14, 2023

(30) Foreign Application Priority Data

Mar. 14, 2022    (TW) .................................. 111109274

(51) Int. Cl.
*G01R 1/073*    (2006.01)
*H05K 1/03*    (2006.01)

(52) U.S. Cl.
CPC ....... *G01R 1/07314* (2013.01); *H05K 1/0306* (2013.01)

(58) Field of Classification Search
CPC ........................... G01R 1/07314; H05K 1/0306
See application file for complete search history.

(56) References Cited

U.S. PATENT DOCUMENTS 6,133,534 A * 10/2000 Fukutomi .............. H05K 3/205
174/257
8,278,965 B2   10/2012 Washio et al.
8,901,949 B2 * 12/2014 Kwon ................ G01R 31/2889
324/755.05
9,176,169 B2   11/2015 Sugai
9,326,378 B2    4/2016 Hashimoto
9,643,271 B2 *  5/2017 Hsieh ................... B23K 1/0016
(Continued)

FOREIGN PATENT DOCUMENTS

CN    108713354 B    12/2020
JP    2003021668 A    1/2003
(Continued)

OTHER PUBLICATIONS

Chu Chien-Chung, Single crystal bulk manufacturing technology,Wafer Foundry and Advance Package Industry Technology, Sep. 15, 2023, p. 80-85, Chuan Hwa Book Co., LTD., R.O.C.
(Continued)

*Primary Examiner* — Paresh Patel
(74) *Attorney, Agent, or Firm* — Rivka Friedman

(57) ABSTRACT

A probe card device is provided, including a thin film substrate having opposite first and second surfaces; a plurality of probe pins disposed over the first substrate of the thin film substrate, wherein the probe pins are not deformable, and the probe pins and the thin film substrate are integrally formed; a ceramic substrate formed by a crystal growth method or glass substrate, having a first surface and a second surface opposite to each other which are electrically connected, the first surface of the ceramic substrate or the glass substrate is disposed on the second surface of the thin film substrate, and is electrically connected to the thin film substrate; and the second surface of the ceramic substrate or the glass substrate are electrically connected to the second surface for electrical connection to another circuit board.

9 Claims, 3 Drawing Sheets

(56) References Cited

U.S. PATENT DOCUMENTS

| | | | |
|---|---|---|---|
| 2003/0010976 A1* | 1/2003 | Grube | G01R 1/07314 257/48 |
| 2004/0012405 A1 | 1/2004 | Cheng et al. | |
| 2004/0207419 A1 | 10/2004 | Ido | |
| 2004/0207425 A1 | 10/2004 | Ido | |
| 2014/0084955 A1* | 3/2014 | Teng | G01R 1/0491 174/262 |
| 2015/0008951 A1* | 1/2015 | Otsubo | G01R 1/0408 156/89.12 |
| 2016/0323996 A1* | 11/2016 | Takemura | G01R 31/2889 |
| 2017/0122981 A1* | 5/2017 | Nasu | G01R 31/2889 |
| 2018/0364280 A1* | 12/2018 | Takemura | G01R 1/07378 |
| 2019/0082531 A1* | 3/2019 | Nasu | H05K 3/4605 |
| 2019/0261514 A1* | 8/2019 | Nasu | H05K 3/429 |
| 2021/0132116 A1 | 5/2021 | Chiu | |
| 2021/0331446 A1 | 10/2021 | Ahn et al. | |

FOREIGN PATENT DOCUMENTS

| | | |
|---|---|---|
| JP | 2010266403 A | 11/2010 |
| JP | 2014106205 A | 6/2014 |
| JP | 2021071472 A | 5/2021 |
| KR | 20210053151 A | 5/2021 |
| TW | 201839409 A | 11/2018 |
| TW | 202117335 A | 5/2021 |
| WO | 2013031822 A1 | 3/2013 |
| WO | 2021194213 A1 | 9/2021 |

OTHER PUBLICATIONS

Similarities and differences between HTCC and LTCC co-fired ceramic substrates, Sep. 19, 2021, http://m.jinruixinpcb.com/mArticle/htccyultccgongshaota.html.

* cited by examiner

PROBE CARD DEVICE

FIELD OF INVENTION

The present disclosure relates to a test field, and more particularly to a probe card device having multi-functional techniques integrated therein.

BACKGROUND

When testing a semiconductor wafer, there are usually high and low drops between various detection contacts over the wafer to be tested. Accordingly, it is necessary to pay attention to compliance and maximum allowable displacement of the probe pin when designing the conventional probe pin. Therefore, in addition to the contact capability of the conventional probe pin, it is also necessary to consider whether it has the flexibility to adapt to the high and low drops between different detection contacts over the wafer to be tested, that is its own deformation ability.

The conventional probe card device is manufactured by mechanically or microelectromechanically making a probe pin have deformability, and then the probe pin is inserted or welded to the housing one by one. Therefore, the probe card device cannot be integrally fabricated, resulting in high production costs.

However, with the trend of miniaturization of semiconductor processes today, there are more and more detection contacts over the wafer to be tested, and the spacing between the detection contacts is getting less and less. Since the conventional probe pin cannot be integrally formed, the spacing between the probe pins cannot be further reduced, and the narrowing of the spacing between the detection contacts on the wafer to be tested cannot be satisfied.

Therefore, the conventional probe card device has encountered problems such as high production cost and limited application.

SUMMARY

In view of this, the present invention provides a probe card device to solve the problems encountered by the conventional probe card device described above.

According to an embodiment, a probe card device is provided, comprising a thin-film substrate, a plurality of probe pins, a ceramic substrate formed by crystal growth or glass substrate, or a plurality of connection points disposed on the second surface of the ceramic substrate or glass substrate or another thin film substrate disposed on the second surface of the ceramic substrate or the glass substrate. The thin-film substrate has opposite first and second surfaces. The plurality of probe pins are disposed on the first surface of the thin film substrate, the plurality of probe pins are not deformable, and the plurality of probe pins and the thin-film substrate are integrally formed. The ceramic substrate formed by crystal growth or glass substrate has opposite first surface and second surfaces, and the ceramic substrate or the glass substrate comprises a plurality of vertical via holes filled with a conductive material, so that the first surface and the second surface of the ceramic substrate or the glass substrate are electrically connected, the first surface of the ceramic substrate or the glass substrate is disposed on the second surface of the thin film substrate and is electrically connected to the thin film substrate. The plurality of connection points are disposed on the second surface of the ceramic substrate or glass substrate or another thin film substrate disposed on the second surface of the ceramic substrate or the glass substrate to electrically connect to a circuit board.

In one embodiment, there is no gap between the first surface of the ceramic substrate or the glass substrate and the second surface of the thin film substrate, and there is no gap between the second surface of the ceramic substrate or the glass substrate and the another thin film substrate.

In one embodiment, horizontal stress of the thin film substrate and the another thin film substrate against the ceramic substrate or glass substrate is substantially the same to eliminate bending or deformation of the ceramic substrate or the glass substrate caused by unequal horizontal stress between the thin film substrate and the another thin film substrate.

In one embodiment, the ceramic substrate comprises aluminum oxide or aluminum nitride.

In one embodiment, the plurality of second connection points of the ceramic substrate or glass substrate or the another thin film substrate is directly electrically connected to a testing device, and the testing device generates and receives testing signals for chip testing.

The probe card device of the invention provides a plurality of embodiments of probe pins being integrally formed in combination with a ceramic substrate. The formed probe pins have functions of the conventional probe housing, and the plurality of organic dielectric material layers in the probe card device located below the probe pins provides the compliance or buffering capability required for each probe pin to adapt to high and low drops of the contact of the wafer to be tested, thereby reducing the manufacturing cost and the pitch between the probe pins, thereby providing a probe card device having a suitable number of probe pins and a suitable pitch between the probe pins in response to the trend of miniaturization of the semiconductor process to fabricate the wafer to be tested.

BRIEF DESCRIPTION OF DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

Probe card devices according to various embodiments of the present invention will be described below in conjunction with FIG. 1-5.

Figure 1:
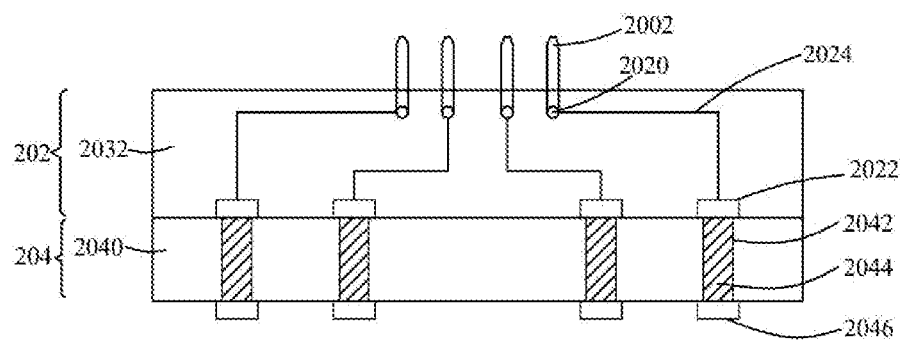
FIG. 1 is a schematic cross-section showing a probe card device according to a first embodiment of the present invention.

Referring to FIG. 1, a cross-section of a probe card device 10 according to a first embodiment of the present invention is shown. The probe card device 10 comprises a thin film substrate 202, a ceramic substrate 204 formed by crystal growth, and a plurality of probe pins 2002. The thin film substrate 202 has an opposite first surface C (see FIG. 4) and a second surface D (see FIG. 4). A body of the ceramic substrate 204 comprises materials such as aluminum oxide (Al2O3) and has a first surface A (see FIG. 3) and a second surface B (see FIG. 3) opposite to each other. A plurality of vertical via holes 2042 and a conductive material 2044 partially filling the vertical via holes 2042 are formed in the ceramic substrate 204 so as to electrically connect the first surface A and the second surface B of the ceramic substrate 204. The first surface A of the ceramic substrate 204 is disposed on the second surface D of the thin film substate 202 to electrically connect the thin film substrate 202. The probe pins 2002 are disposed over a first surface C of the thin film substrate 202 with a predetermined pitch therebetween and partially embedded in the thin film substrate 202. The probe pins 2002 are not deformable and are integrally formed with thin film substate 202.

Figure 6:
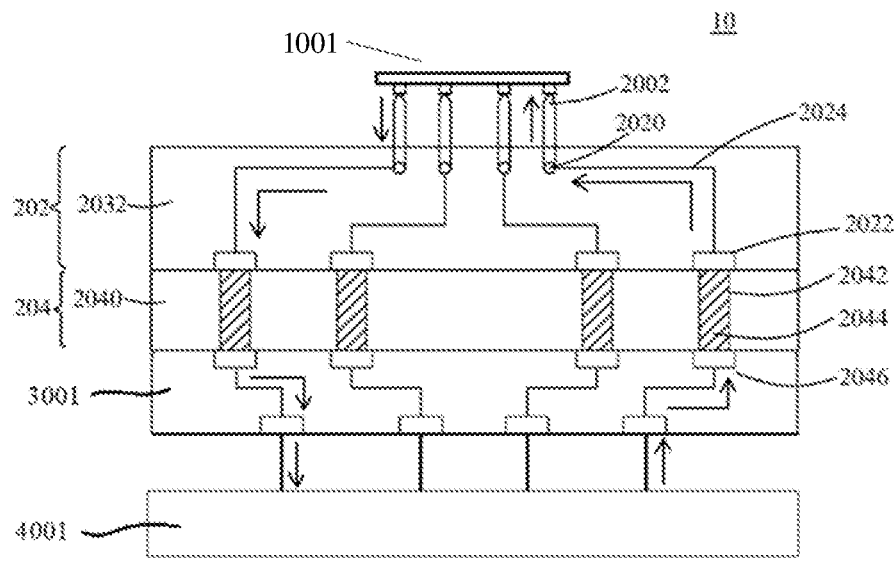
FIG. 6 is a schematic cross-section illustrating an example of chip testing according to an embodiment of the present invention.

Referring to FIG. 6, a plurality of electrical connection points 2046 are provided on the second surface B of the ceramic substrate 204 to electrically connect to a circuit board 3001. The circuit board 3001 is electrically connected to the ceramic substrate 204 and a testing machine 4001, and test signals generated by the testing machine 4001 is processed by the circuit board 3001, and then sent to inside of a chip 1001 through the connection points of the ceramic substrate 204, the film substrate 202, the probe pins 2002, chip connection point, and the chip 1001 that are electrically connected. The test signals are processed by the chip 1001 to generate output signals, and then enters the testing machine 4001 through the chip connection points, the probe pins 2002, the film substrate 202, the ceramic substrate 204, and the circuit board 3001. After the testing machine 4001 receives the test signals, a quality of the chip 1001 can be determined.

Figure 2:
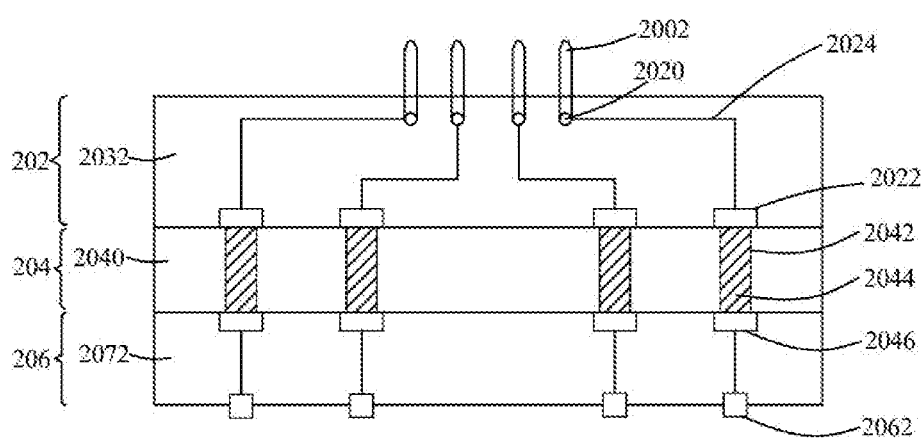
FIG. 2 is a schematic cross-section showing a probe card device according to a second embodiment of the present invention.

Referring to FIG. 2, a schematic cross-section a probe card device 20 according to a second embodiment of the present invention is shown. The probe card device 20 comprises the thin film substrate 202, the plurality of probe pins 2002, the ceramic substrate 204 formed by crystal growth comprising aluminum oxide (Al2O3), and a thin film substrate 206. The structure and function of shown in FIG. 2 are the same as those in FIG. 1 in portions. In FIG. 2, the second surface B of the ceramic substrate 204 is electrically connected to the thin film substrate 206, and the thin film substrate 206 is electrically connected to another circuit board through a plurality of electrical connection points 2062. The function of the circuit board is the same as that of the circuit board 3001 in the first embodiment.

Figure 3:
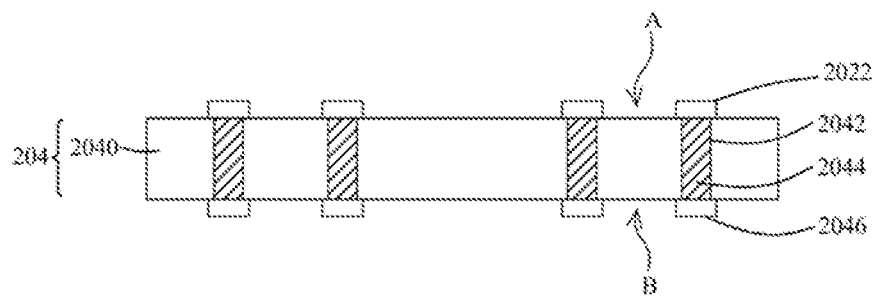
FIG. 3 is a schematic cross-section showing a ceramic substrate shown in FIGS. 1-2.

Referring to FIG. 3, a schematic cross-section of the ceramic substrate 204 in the probe card device 10 and 20 in FIGS. 1 and 2 is shown, and a body 2040 thereof comprises materials such as aluminum oxide ($Al_2O_3$) or aluminum nitride (AlN). The vertical via holes 2042 can be filled with the conductive material 2044 such as copper, and the conductive material 2044 in the vertical via holes 2042 contact the electrical connection points of the film substrate 202 and the electrical connection points of the film substrate 206 respectively. The vertical via holes 2042 may be formed by methods such as laser drilling or etching.

Figure 4:
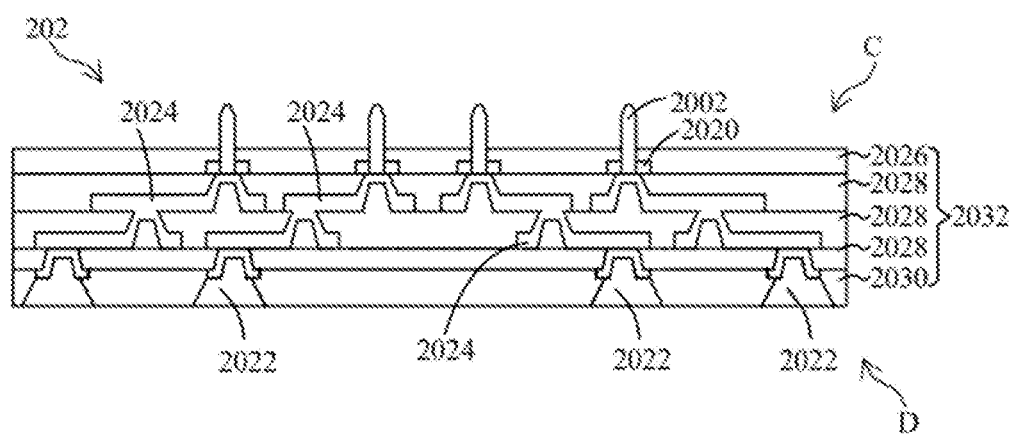
FIG. 4 is a schematic cross-section showing a thin film substrate shown in FIGS. 1-2.

Referring to FIG. 4, the thin film substrate 202 shown in FIG. 1 and FIG. 2 is shown, comprising a thin film body 2032, a plurality of first connection points 2020 embedded in the thin film body 2032 and adjacent to the first surface C of the thin film substrate 202, a plurality of second connection points 2022 formed on the second surface D of the thin film body 2032, and at least one internal metal layer 2024 disposed inside the thin film body 2032. At least one of the first connection points 2020 is electrically connected to at least one of the second connection points 2022 through the at least one internal metal layer 2024, and a distance between two adjacent first connection points 2020 is less than a distance between two adjacent second connection points 2022. The thin film substrate 202 is used to electrically connect the probe pins 2002 with a narrow pitch to the ceramic substrate 204 with a wider pitch. The surfaces of the second connecting points 2022 comprise an electroless nickel electroless palladium and immersion Gold (EN-EPIG), an electroless nickel immersion gold (ENIG), or an organic solderability preservative (OSP).

Figure 7:
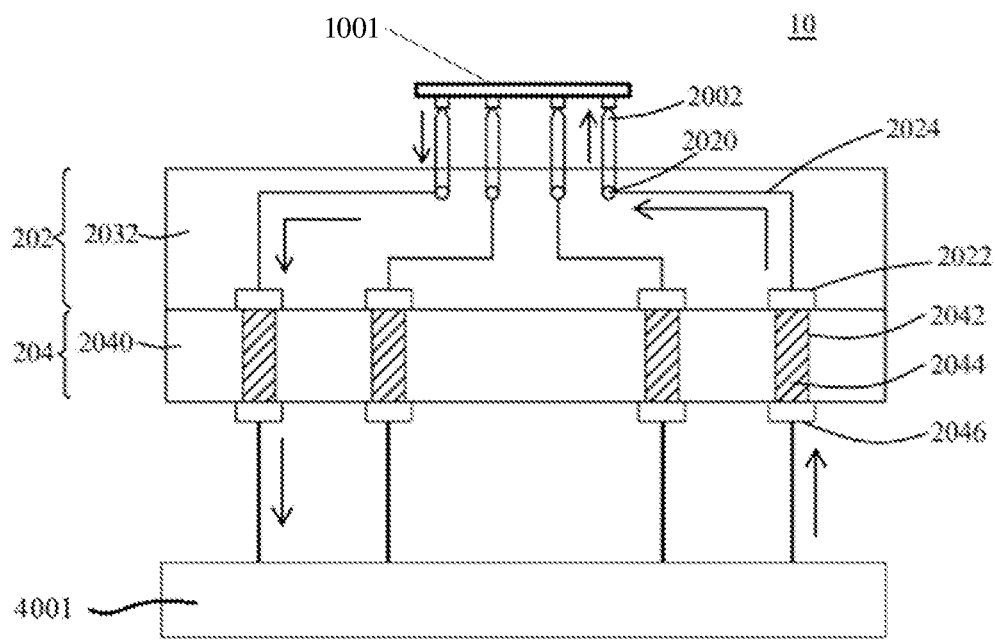
FIG. 7 is a schematic cross-section illustrating another example of chip testing according to an embodiment of the present invention.

One terminal of each of the probe pins 2002 is electrically connected to one of the first connecting points 2020, and the other terminal of each of the probe pins 2002 is electrically connected to a chip contact, which is a contact of a chip to be tested, as shown in FIGS. 6 and 7.

Referring to FIG. 4, the thin film body 2032 comprises the first connection points 2020, the probe pins 2002, at least one internal metal layer 2024, and the second connection points 2022. The film body 2032 further comprises a first surface dielectric layer 2026, at least one internal dielectric layer 2028, and a second surface dielectric layer 2030. In this embodiment, the thin film substrate 202 comprises three internal metal layers 2024 and three internal dielectric layers 2028 but is not limited thereto.

The first connecting points 2020 are embedded in the first surface dielectric layer 2026. The probe pins 2002 are also partially embedded in the first surface dielectric layer 2026 and surrounded by one of the first connecting points 2020. The internal metal layers 2024 are formed in the corresponding inner dielectric layers 2028, and the second connecting points 2022 are formed in the second surface dielectric layer 2030. The first connecting point 2020 and at least one of the probe pins 2002 are electrically connected to at least one of the second connecting points 2022 through at least one internal metal layer 2024.

The thin film substrate 202 may comprise 4 layers to 20 layers. A thickness of each of the first surface dielectric layer 2026, the at least one inner dielectric layer 2028, and the second surface dielectric layer 2030 ranges from 5 μm to 20 μm. The first surface dielectric layer 2026, the at least one inner dielectric layer 2028, and the second surface dielectric layer 2030 may comprise organic dielectric materials such as polyimide. A height of each of the first connecting points 2020, a thickness of the at least one internal metal layer 2024, and a height of each of the second connecting points 2022 ranges from 1 μm to 10 μm. A line width of the at least one internal metal layer 2024 ranges from 2 μm to 100 μm. It is noted that the at least one internal metal layer 2024 may be a whole surface metal layer to be served as a power layer or a ground layer. A via size of the at least one internal metal layer 2024 is ranged from 3 μm to 50 μm.

In the probe card devices 10 and 20 shown in FIGS. 1-2, the probe pins 2002 and the first connecting points 2020 can be formed by semiconductor processing. For example, after forming the first surface dielectric layer 2026, and after positions of the probe pins 2002 and the first connecting points 2020 are determined, a suitable opening is opened in the first surface dielectric layer 2026 by methods such as a laser opening or an organic dielectric layer etching to arrive a metal layer in which the first connecting point 2020 is located. A plurality of probe pins 2002 and a plurality of first connecting points 2020 are simultaneously formed in and over the first surface dielectric layer of the thin film substrate 202 by electroplating or a lithography process cooperating with a physical vapor deposition. The pitch between the probe pins 2002 can be appropriately adjusted by the control of the lithography process to reduce the pitch between the probe pins 2002 to within 30 micrometers, so that tens of thousands of probe pins 2002 can be simultaneously formed over the probe card device 10, thereby reducing the manufacturing cost of the probe card device 10.

In short, due to the arrangement of the ceramic substrate 204, the flatness and support to the probe card devices 10 and 20 can be provided. Similarly, a well-fabricated glass substrate having similar functions of the ceramic substrate 204 can replace the ceramic substrate 204 in above embodiments. The compliance or buffering capability required for each probe pin 2002 to adapt to height differences of contacts of the wafer to be tested can be provided by the elasticity of the organic dielectric material located under the probe pins 2002 of the thin film substrate 202, so that the probe pins 2002 have the function of self-deforming ability of the conventional needles fixed to the needle housing. Thus, from a macroscopic point of view, the tens of thousands of probe pins 2002 disposed over the thin film substrate 202 can have a flatness equivalent to that of the ceramic substate or the glass substrate, and the individual probe pins 2002 also have the compliance or buffering capability of the contact height differences of a wafer to be tested from a microscopic point of view.

Figure 5:
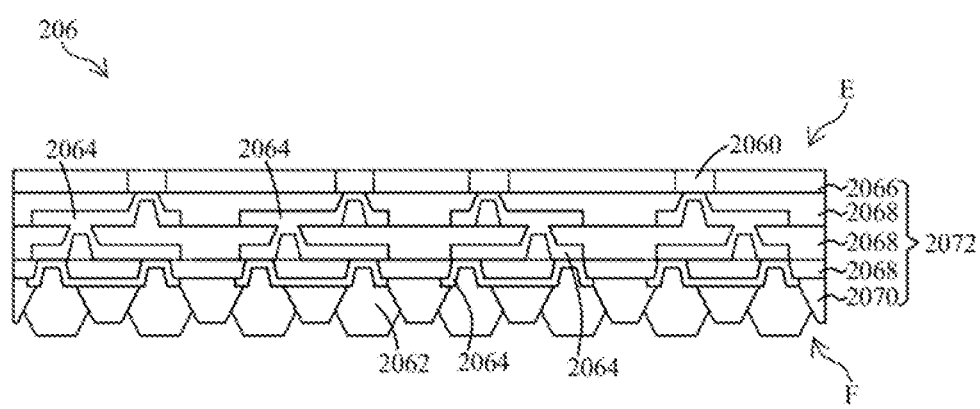
FIG. 5 is a schematic cross-section showing an internal structure of the thin film substrate shown in FIG. 2.

Referring to FIG. 5, a structure of the thin film substrate 206 in the probe card device 20 of FIG. 2 is shown. The film substrate 206 comprises a thin film body 2072 having opposite first surfaces E and second surfaces F, the first connection points 2060, at least one internal metal layer 2064, and the second connection points 2062. The thin film body 2072 comprises a first surface dielectric layer 2066, at least one internal dielectric layer 2068, and a second surface dielectric layer 2070. In this embodiment, the thin film substrate 206 comprises three internal metal layers 2064 and three internal dielectric layers 2068 but is not limited thereto. The first connection points 2060 are electrically connected to the second surface of the ceramic substrate 204, and the second connection points 2062 are electrically connected to a circuit board, which has the same function as the first embodiment of the present invention.

The first connecting points 2060 are embedded in the first surface dielectric layer 2066 and are exposed by the first surface E of the thin film substrate 206. The internal metal layers 2064 are formed in the corresponding inner dielectric layers 2068, and the second connecting points 2062 are formed in the second surface dielectric layer 2070 and are exposed by the second surface F of the thin film substrate 206. At least one of the first connecting points 2060 is electrically connected to at least one of the second connecting points 2062 through at least one internal metal layer 2064.

The thin film substrate 206 may comprise 4 layers to 20 layers. A thickness of each of the first surface dielectric layer 2066, the at least one inner dielectric layer 2068, and the second surface dielectric layer 2070 ranges from 5 micrometers ($\mu m$) to 20 $\mu m$. The first surface dielectric layer 2066, the at least one inner dielectric layer 2068, and the second surface dielectric layer 2070 may comprise organic dielectric materials such as polyimide. A height of each of the first connecting points 2060, a thickness of the at least one internal metal layer 2064, and a height of each of the second connecting points 2062 ranges from 1 $\mu m$ to 10 $\mu m$. A line width of the at least one internal metal layer 2064 ranges from 2 $\mu m$ to 100 $\mu m$. It is noted that the at least one internal metal layer 2064 may be a whole surface metal layer to be served as a power layer or a ground layer. A via size of the at least one internal metal layer 2064 is ranged from 3 $\mu m$ to 50 $\mu m$.

Referring to FIG. 2, in another embodiment of the present invention, the thin film substrate 202 and the thin film substrate 206 have no gaps with the ceramic substrate 204, and the thin film substrate 202 and the thin film substrate 206 have substantially the same horizontal stress against the glass substrate so as to eliminate bending or deformation of the ceramic substrate or the glass substrate due to the unequal horizontal stress caused by the upper thin film substrate 202 and the lower thin film substrate 206.

As mentioned above, the ceramic substrate or glass substrate after grinding and polishing can be used as a carrier plate, and a dielectric layer is formed by spin coating or spray coating and baking, and then the dielectric layer is attached to the carrier plate to form a completely sealed structure, and other structure or elements are the same as the description of the above-mentioned embodiment of FIG. 2. In order to make the horizontal stress of the thin film substrate 202 and the thin film substrate 206 substantially the same, the total film thickness of the dielectric layers in the thin film substrate 202 and the thin film substrate 206 are designed to be approximately the same, and the total film thickness of the metal layers in the thin film substrate 202 and the thin film substrate 206 are designed to be approximately the same.

Referring to FIG. 1 and FIG. 2 and FIG. 7, in yet another embodiment of the present invention, the second connection points 2046 of the ceramic substrate or the connection points 2062 of the thin film substrate can be electrically connected to a testing machine 4001, and the testing machine 4001 generates and receives test signals for chip testing. It can be done by integrating the circuit board 3001 described in the above paragraph [0021] into the thin film substrate 202, or the circuit board described in the above paragraph [0022] into the thin film substrate 206.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A probe card device, comprising:
   a thin-film substrate having opposite first and second surfaces, wherein the thin-film substrate comprises a thin film body and a plurality of first connection points embedded in the thin film body;
   a plurality of probe pins disposed on the first surface of the thin film substrate, wherein one terminal of each of the probe pins is electrically connected to connection points embedded in the thin film body, and the other terminal of each of the probe pins is used to directly contact a chip contact of a chip for chip testing, wherein the probe pins are partially embedded in the thin film body, wherein the plurality of probe pins are not deformable, and the plurality of probe pins and the thin-film substrate are integrally formed;
   a ceramic substrate formed by crystal growth or glass substrate, having opposite first surface and second surfaces, wherein the ceramic substrate or the glass substrate comprises a plurality of vertical via holes filled with a conductive material, so that the first surface and the second surface of the ceramic substrate or the glass substrate are electrically connected, the first surface of the ceramic substrate or the glass substrate is disposed on the second surface of the thin film substrate and is electrically connected to the thin film substrate, wherein the ceramic substrate formed by crystal growth or glass substrate is processed by grinding and polishing, and then a dielectric layer is formed by spin coating or spray coating and baking and then the dielectric layer is attached to the ceramic substrate formed by crystal growth or glass substrate to form a completely sealed thin-film substrate with the probe pins; and a plurality of second connection points disposed on the second surface of the ceramic substrate or glass substrate to electrically connect to a circuit board.

2. The probe card device according to claim 1, wherein there is no gap between the first surface of the ceramic substrate or the glass substrate and the second surface of the thin film substrate.

3. The probe card device according to claim 1, wherein the ceramic substrate comprises aluminum oxide or aluminum nitride.

4. The probe card device according to claim 1, wherein the plurality of second connection points of the ceramic substrate or glass substrate are used to directly electrically connect to a testing machine, which generates and receives testing signals for the chip testing.

5. A probe card device, comprising:
a thin-film substrate having opposite first and second surfaces, wherein the thin-film substrate comprises a thin film body and a plurality of connection points embedded in the thin film body;
a plurality of probe pins disposed on the first surface of the thin film substrate, wherein one terminal of each of the probe pins is electrically connected to connection points embedded in the thin film body, and the other terminal of each of the probe pins is used to directly contact a chip contact of a chip for chip testing, wherein the probe pins are partially embedded in the thin film body, wherein the plurality of probe pins are not deformable, and the plurality of probe pins and the thin-film substrate are integrally formed;
a ceramic substrate formed by crystal growth or glass substrate, having opposite first surface and second surfaces, wherein the ceramic substrate or the glass substrate comprises a plurality of vertical via holes filled with a conductive material, so that the first surface and the second surface of the ceramic substrate or the glass substrate are electrically connected, the first surface of the ceramic substrate or the glass substrate is disposed on the second surface of the thin film substrate and is electrically connected to the thin film substrate, wherein the ceramic substrate formed by crystal growth or glass substrate is processed by grinding and polishing, and then a dielectric layer is formed by spin coating or spray coating and baking and then the dielectric layer is attached to the ceramic substrate formed by crystal growth or glass substrate to form a completely sealed thin-film substrate with the probe pins; and
another thin film substrate disposed on the second surface of the ceramic substrate or the glass substrate to electrically connect to a circuit board.

6. The probe card device according to claim 5, wherein there is no gap between the second surface of the ceramic substrate or the glass substrate and the another thin film substrate.

7. The probe card device according to claim 6, wherein horizontal stress of the thin film substrate and the another thin film substrate against the ceramic substrate or glass substrate is substantially the same to eliminate bending or deformation of the ceramic substrate or the glass substrate caused by unequal horizontal stress between the thin film substrate and the another thin film substrate.

8. The probe card device according to claim 5, wherein the ceramic substrate comprises aluminum oxide or aluminum nitride.

9. The probe card device according to claim 5, wherein the another thin film substrate is used to directly electrically connect to a testing machine, which generates and receives testing signals for chip testing.

* * * * *